(12) United States Patent
Hsu

(10) Patent No.: US 7,137,440 B2
(45) Date of Patent: Nov. 21, 2006

(54) HEAT SINK FOR ELECTRONIC DEVICE

(75) Inventor: Cheng-Chung Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 237 days.

(21) Appl. No.: 10/933,042

(22) Filed: Sep. 2, 2004

(65) Prior Publication Data
US 2006/0042783 A1 Mar. 2, 2006

(51) Int. Cl.
*H05K 7/20* (2006.01)

(52) U.S. Cl. ............................ 165/80.3; 361/704

(58) Field of Classification Search ............... 165/80.3, 165/185; 361/704
See application file for complete search history.

(56) References Cited

U.S. PATENT DOCUMENTS

| | | | | |
|---|---|---|---|---|
| 5,099,550 A | * | 3/1992 | Beane et al. | 24/555 |
| 5,323,845 A | * | 6/1994 | Kin-shon | 165/80.3 |
| 5,448,449 A | * | 9/1995 | Bright et al. | 361/704 |
| 5,699,229 A | * | 12/1997 | Brownell | 361/719 |
| 5,774,335 A | * | 6/1998 | Pare et al. | 361/704 |
| 5,889,653 A | * | 3/1999 | Clemens et al. | 361/704 |
| 6,175,499 B1 | * | 1/2001 | Adams et al. | 361/704 |
| 2003/0214787 A1 | * | 11/2003 | Liu | 361/704 |
| 2004/0066626 A1 | * | 4/2004 | Lee et al. | 361/704 |
| 2005/0174739 A1 | * | 8/2005 | Chen et al. | 361/704 |
| 2005/0225946 A1 | * | 10/2005 | Fan et al. | 361/710 |
| 2005/0263264 A1 | * | 12/2005 | Chen et al. | 165/80.2 |
| 2006/0027635 A1 | * | 2/2006 | Schaenzer et al. | 228/246 |

* cited by examiner

*Primary Examiner*—Allen J. Flanigan
(74) *Attorney, Agent, or Firm*—Tim Tingkang Xia, Esq.; Morris Manning Martin L

(57) ABSTRACT

A heat sink has a substrate with first pivoting portions thereon. A heat scattering member has a plurality of fins on a top thereof, a protrusion on a periphery thereof and a pressing portion between the protrusion and the distal fin. A clip member has connection portions, second pivoting portions and a lock portion. The second pivoting portions are projected from ends of the connection portions to be pivotally connected to the first pivoting portions of the substrate. The clip member is moved between a fist position and a second position. The lock portions are projected from the other ends of the connection portions to be engaged with the pressing portions while the lock portion is moved to the second position.

20 Claims, 5 Drawing Sheets

HEAT SINK FOR ELECTRONIC DEVICE

BACKGROUND OF THE INVENTION

1. Field of the Invention

The present invention relates generally to a heat sink, and more particularly to a heat sink capable of engaging an electronic device with the heat sink rapidly.

2. Description of the Related Art

To maintain a computer running well, it is well known in the electronic industry to mount a heat sink on an electronic device, which generates heat while working (such as CPU), to keep the electronic device under a suitable temperature.

In prior art, the heat sink is provided with an elastic pressing member to secure the heat sink on the electronic device or on a circuit board. The conventional pressing members are classified into two types and they are described hereunder.

The pressing member of the first type is that the pressing member crosses above the electronic device and ends thereof are secured on a base. On one conventional technology, the pressing member is a plate-like member to provide a well performance for pressing the electronic device. The width of such pressing member reduces the area on the heat sink to provide fins, hence it affect heat dissipating. The other conventional technology provides a strip-like pressing member with a narrow width. Such pressing member gives a less effect for the fins provided on the heat sink, but the shape of the pressing member is twisted to provide enough pressure for pressing the heat sink. Such pressing is easy to be deformed and some of the fins must be provided at specific positions to lock protrusions of the pressing member. This increases the cost of manufacture.

The second type provides the pressing members at opposite sides thereof. One conventional technology provides the electronic device with a mount at opposite sides thereof to connect the pressing members respectively. Such structure has a poor stability and a higher cost. The other technology provides a shaft running through the stacked heat sink plates. The shaft is clipped at opposite ends by an elastic clip respectively and is installed on a base. The structure of the second invention is complex and there is no stable structure between the heat sink plates and the base.

SUMMARY OF THE INVENTION

The primary object of the present invention is to provide a heat sink, which has a simple structure and is installed in an easier and stable condition.

According to the object of the present invention, a heat sink comprises a substrate having a predetermined shape and having a first pivoting portion on a predetermined portion thereof. A heat scattering member is provided on the substrate, which has a plurality of fins on a top thereof, a protrusion on a periphery thereof and a pressing portion between the protrusion and the distal fins, wherein the pressing portion is above the pivoting portion of the substrate. A clip member, which is to secure the heat scattering member on the substrate, has a connection portion, a second pivoting portion and a lock portion. The second pivoting portion is projected from an end of the connection portion to a predetermined direction for a predetermined length to be pivotally connected to the first pivoting portion of the substrate. The clip member is moved between a fist position and a second position. The lock portion is projected from an end of the connection portion, which is opposite to the second pivoting portion, to a predetermined direction for a predetermined length to be engaged with the pressing portion while the lock portion is moved to the second position.

DETAILED DESCRIPTION OF THE PREFERRED EMBODIMENTS

Figure 1:
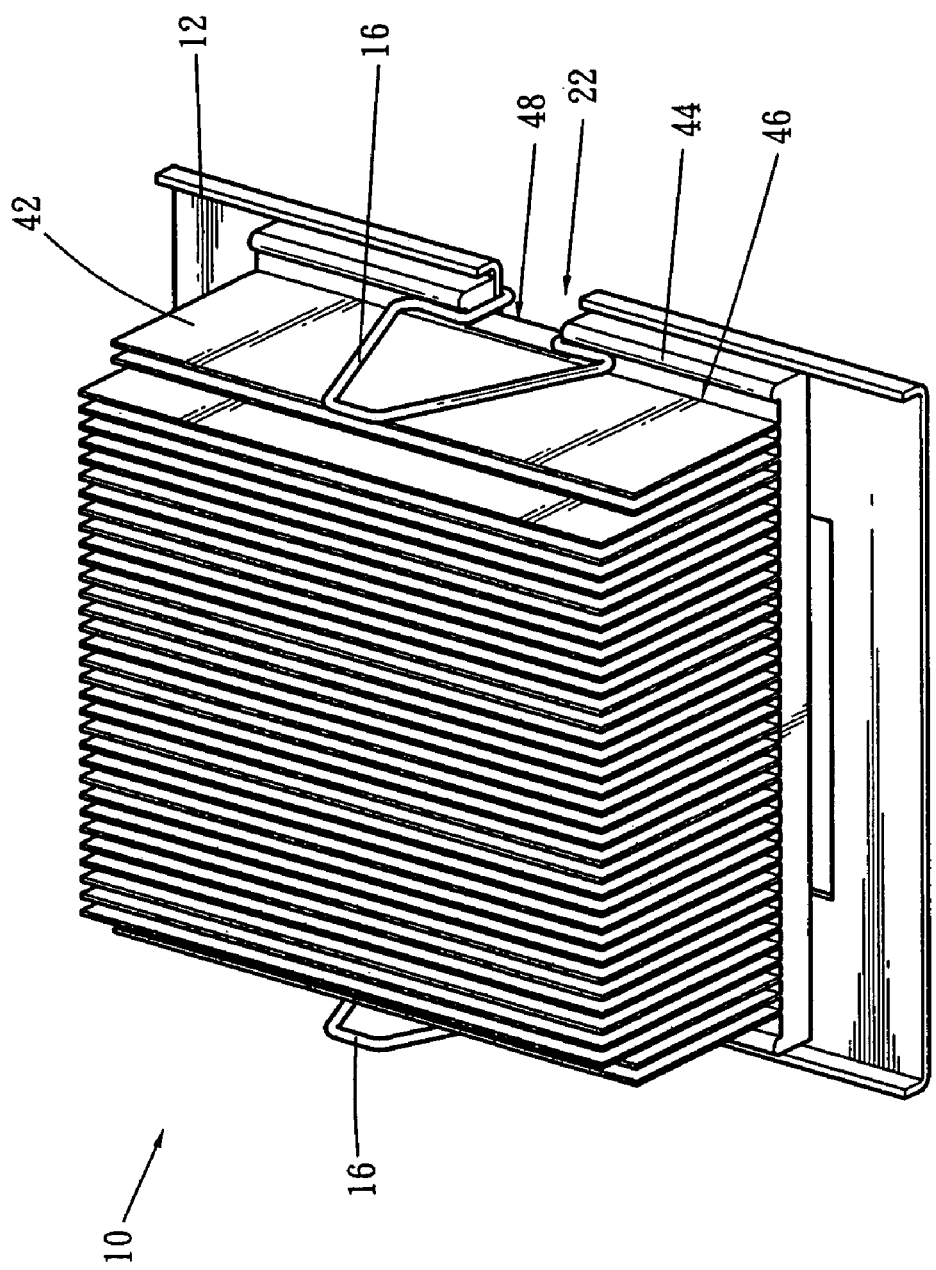
FIG. 1 is a perspective view of a first preferred embodiment of the present invention.
Figure 2:
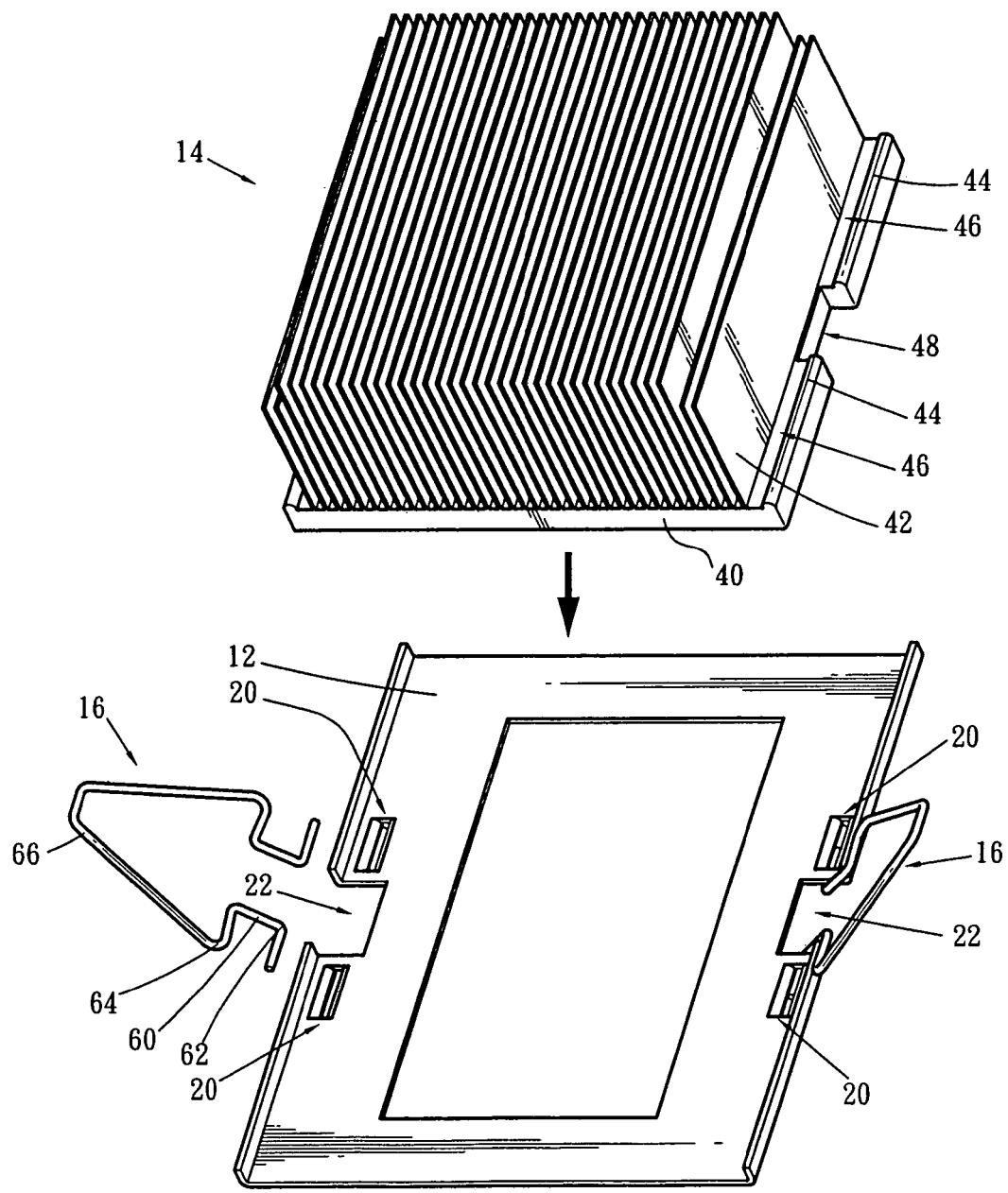
FIG. 2 is an exploded view of the first preferred embodiment of the present invention.
Figure 3:
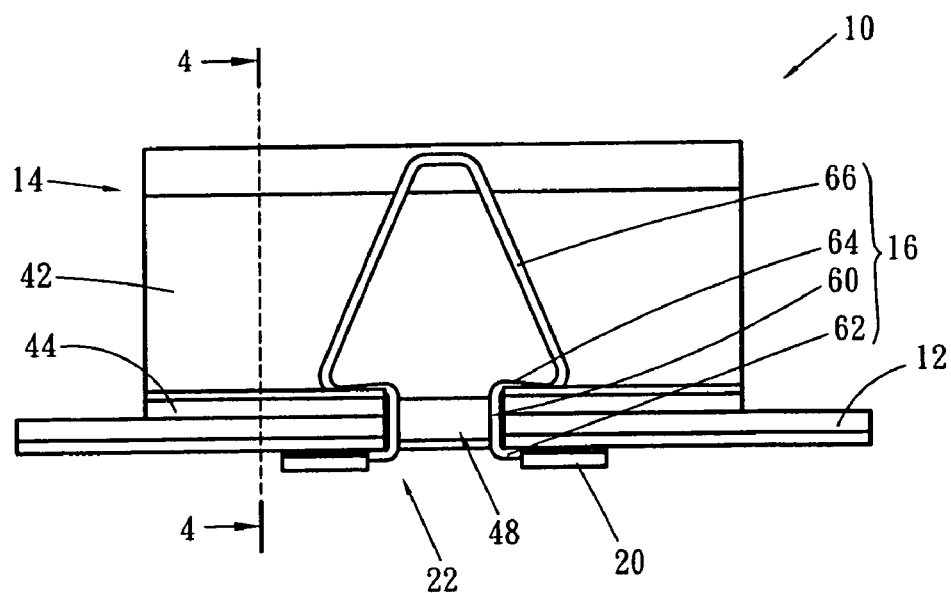
FIG. 3 is a front view of the first preferred embodiment of the present invention.
Figure 4:
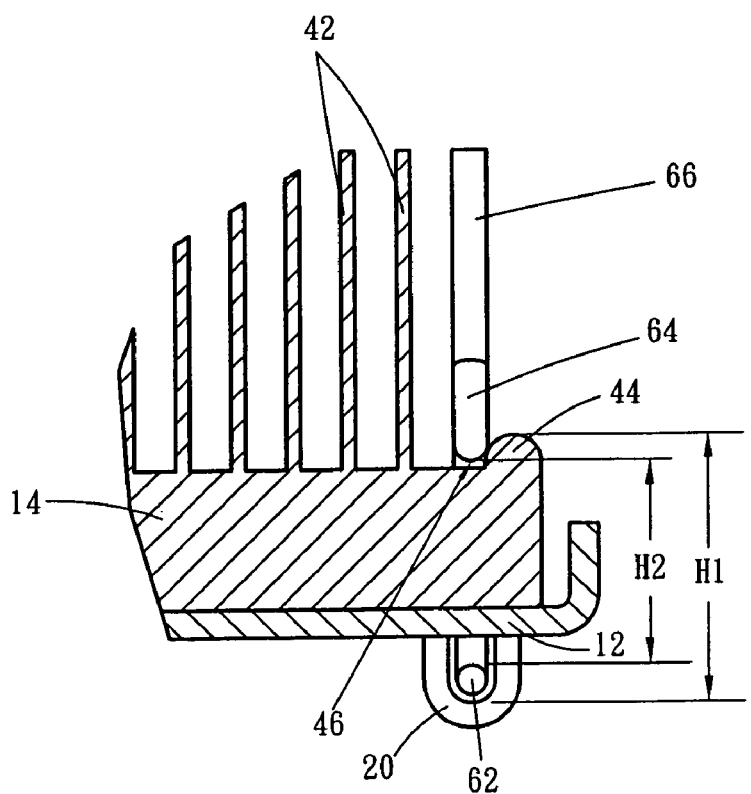
FIG. 4 is a sectional view along 4—4 line in FIG. 3.
Figure 5:
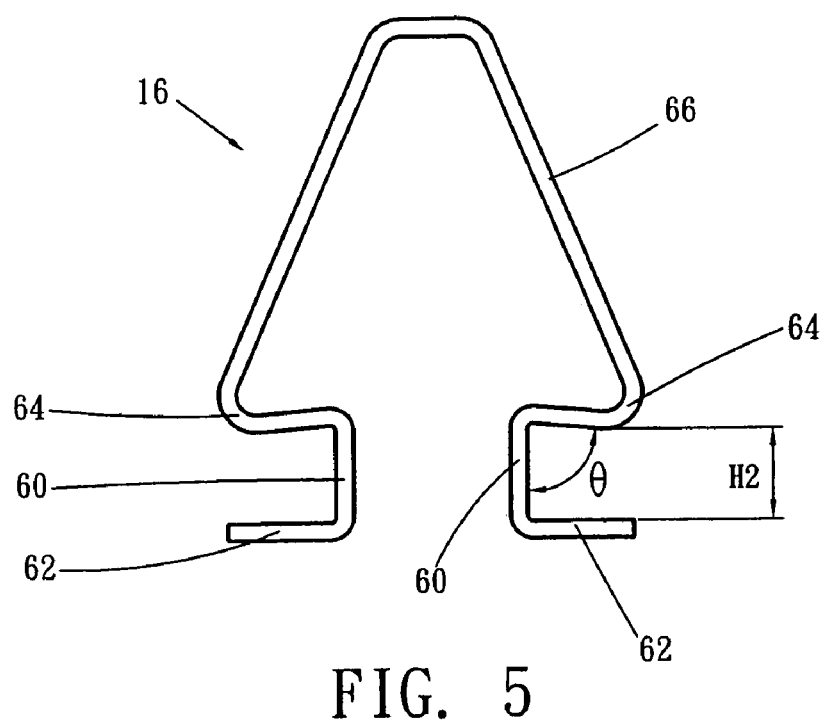
FIG. 5 is a front view of the clip member of the first preferred embodiment of the present invention.

As shown in FIGS. 1 to 5, a heat sink 10 of the first preferred embodiment of the present invention comprises a substrate 12, a heat scattering member 14 provided on a top of the substrate 12, and a clip member 16 to secure opposite sides of the heat scattering member 14 on the substrate 12.

The substrate 12 is rectangular and is made of metal. The substrate 12 has two pairs of first pivoting portions 20 on bottom of the opposite sides respectively. The first pivoting portions 20 are molded by pressing to be barrel-like members. The first pivoting portions 20 on the same side have an axial line running through both of them. Two first apertures 22 are provided at the opposite sides of the substrate 12 between the first pivoting portions 20 respectively.

The heat scattering member 14 has a base 40, a plurality of fins 42 on a top of the base 40, two pairs of protrusions 44 on opposites sides of the base 40 respectively, two pairs of pressing portions 46 on the top of the substrate 40 between each of the protrusions 44 and the neighboring fins 42 respectively, and two second apertures 48 on opposite sides of the heat scattering member 14 between two of the corresponding protrusions 44 and the pressing portion 46 respectively. The first and the second apertures 22 and 48 on the same side are located side by side.

The clip member 16 is made from a bent elastic metal string. The clip member 16 is symmetrical and has two connection portions 60. Two second pivoting portions 62 are respectively projected from bottoms of the connection portions 60 (according to the drawing) to opposite sides. Elongate directions of the second pivoting portions 62 are perpendicular to elongate directions of the connection portions 60 respectively. Two lock portions 64 are projected from tops of the connection portions 60 to opposite sides respectively. Between elongate directions of the lock portions 64 and the elongate directions of the connection portions 60 are an included angle θ and the angles θ are less than 90 degrees. A V-shaped gripper 66 is connected to the lock portions 64 respectively.

For assembly, the second pivoting portions 62 are inserted into the corresponding first pivoting portions 20 respectively. The clip member 16 is moved along the opposite sides of the substrate 12 between a first position, in which the heat scattering member 14 is released, and a second position, in which the heat scattering member 14 is clipped by the clip member 16. In the second position, the connection portions 60 enter the corresponding second apertures 48 via the first apertures 22 respectively.

A distance H1 between the first pivoting portion 20 and the protrusion 44 is greater than a distance H2 between the second pivoting portion 62 and the lock portion 64. While the clip member 16 moves from the first position to the second position and after the lock portion 64 is extended and crosses over the protrusion 44 to reach the pressing portion 46, the lock portion 64 elastically presses the heat scattering member 14 to make it secure on the substrate 12 firmly.

Figure 6:
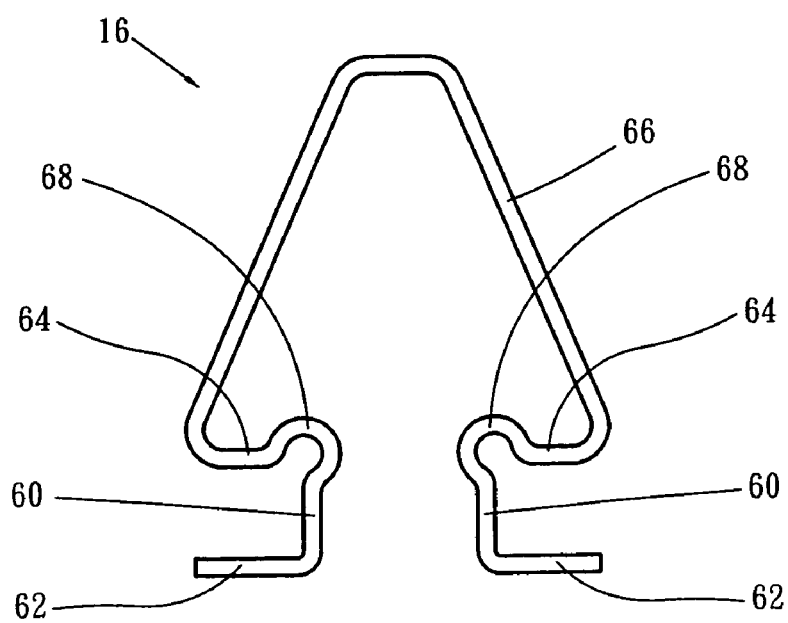
FIG. 6 is a front view of the clip member of a second preferred embodiment of the present invention.
Figure 7:
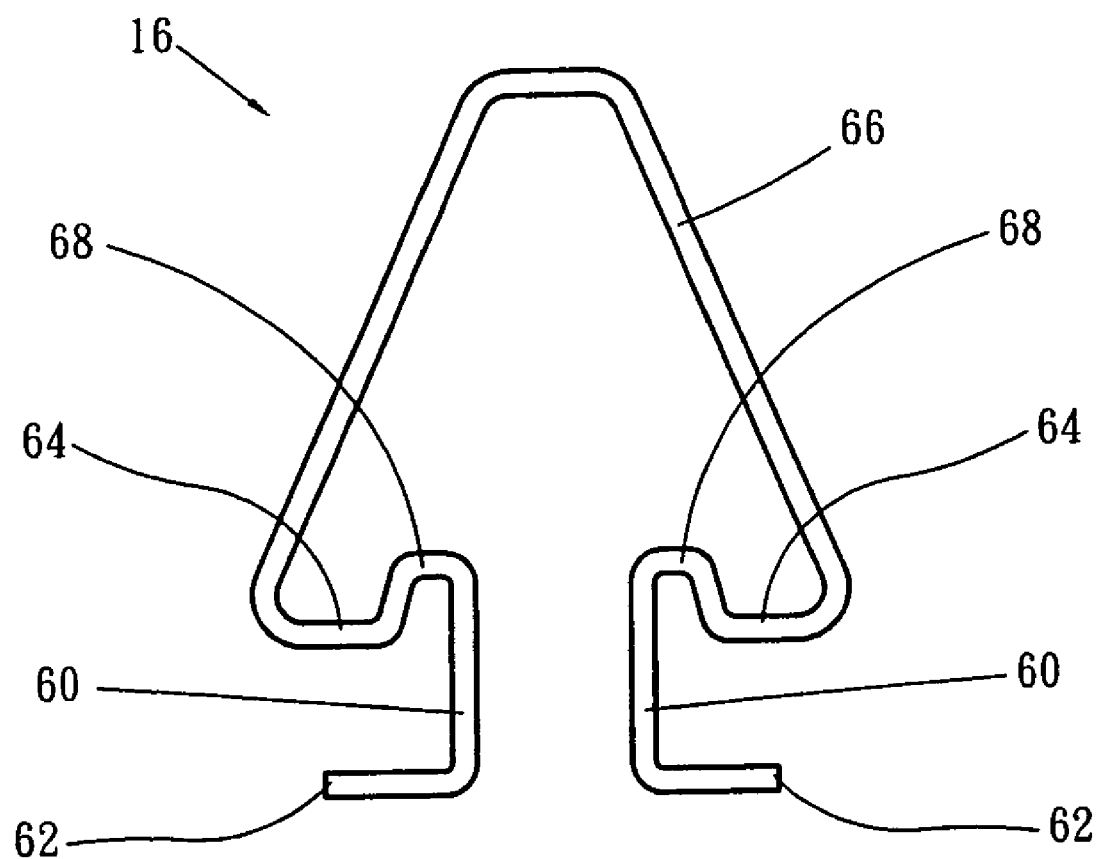
FIG. 7 is a front view of the clip member of a third preferred embodiment of the present invention.

The connection portions 60 each have a section, which connects the lock portions 64, and the sections are bent into acute angles. FIG. 6 shows another clip member with an extension portion 68. The extension portion 68 is molded on the connection portion 60 into a single unit. The extension portion 68 is made into an arc-like member of a ¾ circle. An elongated axis of the lock portion 64 is parallel to an elongated axis of the second pivoting portion 62. The extension portion 68 also can be made into a waved member as shown in FIG. 7. These are the equivalent elements of the present invention.

There are the preferred embodiments of the present invention and the scope of the present invention is not restricted only in the preferred embodiments. The one who knows the skill should acknowledge that there still are equivalent embodiments within the scope of the present invention. The scope of the present invention is defined in the claims and any equivalent embodiment should be still in the scope of the present invention.

What is claimed is:

1. A heat sink, comprising:
    a substrate having a predetermined shape and having a first pivoting portion on a predetermined portion thereof;
    a heat scattering member provided on the substrate, which has a plurality of fins on a top thereof, a protrusion on a periphery thereof and a pressing portion between the protrusion and the distal fin, wherein the pressing portion is above the pivoting portion of the substrate; and
    a clip member for securing the heat scattering member on the substrate having a connection portion, a second pivoting portion projected from an end of the connection portion to a predetermined direction for a predetermined length to be pivotally connected to the first pivoting portion of the substrate, wherein the clip member is moved between a first position and a second position, and a lock portion projected from an end of the connection portion, which is opposite to the second pivoting portion, to a predetermined direction for a predetermined length to be engaged with the pressing portion while the lock portion is moved to the second position,
    and wherein the substrate is made of a ductile material and the first pivoting portion is mold by pressing at bottoms of opposite sides of the substrate.

2. The heat sink as defined in claim 1, wherein the substrate has two pairs of the pivoting portions with a predetermined distance therebetween and an aperture, with a predetermined depth, between the pivoting portions and the connection portion is received in the aperture with an end thereof at above the substrate and an opposite end thereof at under the substrate while the clip member is moved to the second position.

3. The heat sink as defined in claim 1, wherein the protrusion has a round distal end.

4. The heat sink as defined in claim 1, wherein a distance between the top of the first pivoting portion and the top of the protrusion is greater than a distance between the top of the second pivoting portion and the base of the lock portion.

5. The heat sink as defined in claim 1, wherein the connection portion is provided with an extension portion at where the connection portion is connected to the lock portion and the extension portion is an arc-like member and the arc is greater than ninety degrees.

6. The heat sink as defined in claim 5, wherein an included angle between an elongated axis of the connection portion and an elongated axis of the lock portion is equal to ninety degrees.

7. The heat sink as defined in claim 6, wherein an included angle between an elongated axis of the connection portion and an elongated axis of the lock portion is equal to ninety degrees.

8. The heat sink as defined in claim 1, wherein the heat sink has two of the clip members provided in symmetry and a gripper with ends connected to the clip members respectively.

9. The heat sink as defined in claim 8, wherein the clip members and the gripper are made of a single elastic metal string.

10. A heat sink, comprising:
    a substrate having a predetermined shape and having a first pivoting portion on a predetermined portion thereof;
    a heat scattering member provided on the substrate, which has a plurality of fins on a top thereof, a protrusion on a periphery thereof and a pressing portion between the protrusion and the distal fin, wherein the pressing portion is above the pivoting portion of the substrate; and
    a clip member for securing the heat scattering member on the substrate having a connection portion, a second pivoting portion projected from an end of the connection portion to a predetermined direction for a predetermined length to be pivotally connected to the first pivoting portion of the substrate, wherein the clip member is moved between a first position and a second position, and a lock portion projected from an end of the connection portion, which is opposite to the second pivoting portion, to a predetermined direction for a predetermined length to be engaged with the pressing portion while the lock portion is moved to the second position, and wherein an included angle between an elongated direction of the connection portion and an elongated direction of the lock portion is less than ninety degrees.

11. The heat sink as defined in claim 10, wherein the substrate is made of a ductile material and the first pivoting portion is mold by pressing at bottoms of opposite sides of the substrate.

12. The heat sink as defined in claim 10, wherein a distance between the top of the first pivoting portion and the top of protrusion portion is greater than a distance between the top of the second pivoting portion and the base of the lock portion.

13. The heat sink as defined in claim 10, wherein the connection portion is provided with an extension portion at where the connection portion is connected to the lock portion and the extension portion is an arc-like member and the arc is greater than ninety degrees.

14. The heat sink as defined in claim 13, wherein an included angle between an elongated axis of the connection portion and an elongated axis of the lock portion is equal to ninety degrees.

15. The heat sink as defined in claim 10, wherein the heat sink has two of the clip members provided in symmetry and a gripper with ends connected to the clip members, respectively.

16. A heat sink, comprising:
a substrate having a predetermined shape and having a first pivoting portion on a predetermined portion thereof;
a heat scattering member provided on the substrate, which has a plurality of fins on a top thereof, a protrusion on a periphery thereof and a pressing portion between the protrusion and the distal fin, wherein the pressing portion is above the pivoting portion of the substrate; and
a clip member for securing the heat scattering member on the substrate having a connection portion, a second pivoting portion projected from an end of the connection portion to a predetermined direction for a predetermined length to be pivotally connected to the first pivoting portion of the substrate, wherein the clip member is moved between a first position and a second position, and a lock portion projected from an end of the connection portion, which is opposite to the second pivoting portion, to a predetermined direction for a predetermined length to be engaged with the pressing portion while the lock portion is moved to the second position, and wherein the connection portion is provided with an extension portion at where the connection portion is connected to the lock portion and the extension portion is a waved member.

17. The heat sink as defined in claim 16, wherein the substrate is made of a ductile material and the first pivoting portion is mold by pressing at bottoms of opposite sides of the substrate.

18. The heat sink as defined in claim 16, wherein the protrusion has a round distal end.

19. The heat sink as defined in claim 16, wherein an included angle between an elongated axis of the connection portion and an elongated axis of the lock portion is equal to ninety degrees.

20. The heat sink as defined in claim 16, wherein the heat sink has two of the clip members provided in symmetry and a gripper with ends connected to the clip members, respectively.

* * * * *